US006891748B2

(12) United States Patent
Tsuchida et al.

(10) Patent No.: US 6,891,748 B2
(45) Date of Patent: May 10, 2005

(54) MRAM HAVING MEMORY CELL ARRAY IN WHICH CROSS-POINT MEMORY CELLS ARE ARRANGED BY HIERARCHICAL BIT LINE SCHEME AND DATA READ METHOD THEREOF

(75) Inventors: Kenji Tsuchida, Kawasaki (JP); Yoshihisa Iwata, Yokohama (JP); Tomoki Higashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/621,886

(22) Filed: Jul. 18, 2003

(65) Prior Publication Data

US 2004/0233709 A1 Nov. 25, 2004

(30) Foreign Application Priority Data

May 22, 2003 (JP) ........................................ 2003-144792

(51) Int. Cl.[7] .............................................. G11C 11/00
(52) U.S. Cl. .................................... 365/158; 365/230.06
(58) Field of Search ............................. 365/158, 230.06

(56) References Cited

U.S. PATENT DOCUMENTS 6,259,644 B1   7/2001   Tran et al. .................. 365/209

OTHER PUBLICATIONS

US 2004/0125648 A1—U.S. Appl. No. 10/431,369.*

Roy Scheuerlein, et al., "A 10ns Read and Write Non-Volatile Memory Array Using a Magnetic Tunnel Junction and FET Switch in each Cell", ISSCC 2000 Digest of Technical Paper, 2000, pp. 128–129.

* cited by examiner

*Primary Examiner*—M. Tran
(74) *Attorney, Agent, or Firm*—Oblon, Spivak, McClelland, Maier & Neustadt, P.C.

(57) ABSTRACT

A memory cell array is of a hierarchical bit line scheme in which cross-point memory cells that exhibit a magnetoresistive effect are laid out in a matrix, and a read bit line to be used in a data read mode is constituted by a main bit line and a sub bit line. A column select circuit selects a main bit line and connects it to a sense amplifier. A row select circuit selects a word line for each cell unit, and in read operation, sets, in a floating state, word lines to which unselected memory cells connected to the sub bit line to which a selected memory cell is connected are connected, and sets the remaining word lines connected to sub bit lines which do not include the selected memory cell to a potential substantially equal to the main bit line.

27 Claims, 11 Drawing Sheets

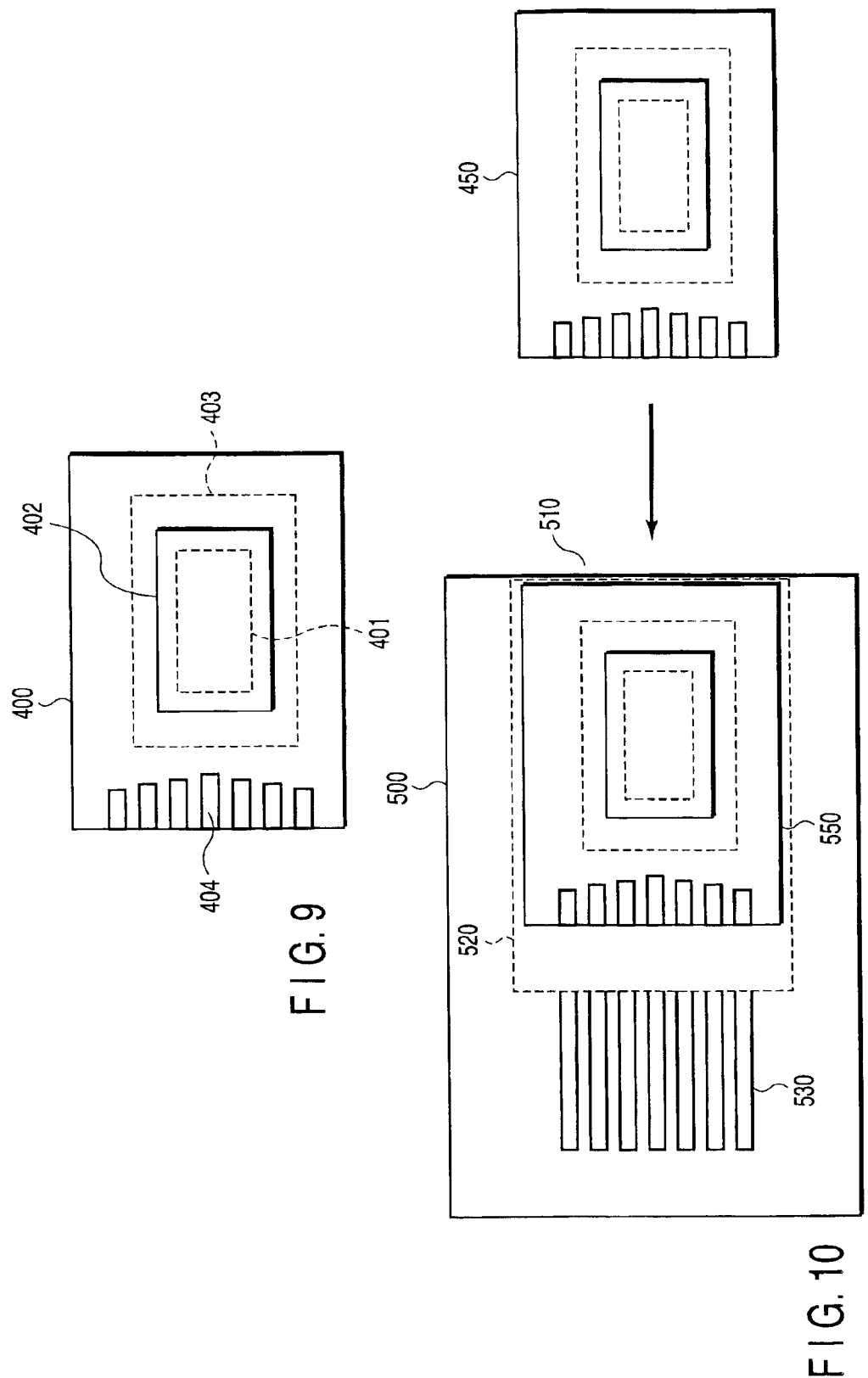

MRAM HAVING MEMORY CELL ARRAY IN WHICH CROSS-POINT MEMORY CELLS ARE ARRANGED BY HIERARCHICAL BIT LINE SCHEME AND DATA READ METHOD THEREOF

CROSS-REFERENCE TO RELATED APPLICATIONS

This application is based upon and claims the benefit of priority from the prior Japanese Patent Application No. 2003-144792, filed May 22, 2003, the entire contents of which are incorporated herein by reference.

BACKGROUND OF THE INVENTION

1. Field of the Invention

The present invention relates to a magnetic random access memory (MRAM) which stores binary information using the magnetoresistive effect, and a data read method thereof and, more particularly, to potential control of main/sub bit lines and word lines in the read mode of a memory cell array in which cross-point memory cells are arranged by a divided bit line structure (hierarchical bit line scheme).

2. Description of the Related Art

MRAMs are devices which perform memory operation by storing binary information using the magnetoresistive effect. They are regarded as one of candidates for universal storage devices that can realize all the nonvolatility, high integration degree, high reliability, low power consumption, and high operation speed and have been developed in various companies.

Two effects, i.e., the GMR (Giant MagnetoResistive) effect and TMR (Tunneling MagnetoResistive) effects are mainly known as magnetoresistive effects. An element (GMR element) using the GMR effect stores information by using a phenomenon that the resistance of a conductor sandwiched between two ferromagnetic layers changes depending on the direction of spin of the ferromagnetic layers on the upper and lower sides. In the GMR element, however, the MR ratio that indicates the ratio of a change in magnetoresistance is as low as 10%. For this reason, the read signal of stored information is small. How to ensure the read margin presents a significant challenge in implementing MRAMs. The practical utility is believed to be still insufficient at present.

As a typical element which uses the TMR effect, an MTJ (Magnetic Tunnel Junction) element which uses a change in magnetoresistance due to a spin polarization tunneling effect is known. The MTJ element has a multilayered structure in which an insulating film (tunnel insulating film) is sandwiched between two metal layers formed from ferromagnetic layers. In the MTJ element, when the directions of spin of the upper and lower ferromagnetic layers are parallel, the tunnel probability between the two ferromagnetic layers through the tunnel insulating film is maximum. As a result, the resistance value is minimized. Conversely, when the directions of spin are anti-parallel, the tunnel probability is minimum. Accordingly the resistance is maximized. To realize the two spin states, normally, one of the ferromagnetic layers (magnetic films) has a fixed magnetization direction and is set not to receive the effect of external magnetization. Generally, the ferromagnetic layer with the fixed magnetization direction is called a pinned layer. The magnetization direction of the other ferromagnetic layer (magnetic film) can be programmed to be parallel or anti-parallel to the pinned layer in accordance with the direction of an applied magnetic field. This ferromagnetic layer is generally called a free layer and has the function of storing information. Currently, MTJ elements with an MR ratio of more than 50% are available. The MTJ elements are becoming the mainstream of MRAM development.

In the write mode of an MRAM using MTJ elements, to reverse the magnetization direction of the free layer, currents having predetermined magnitudes or more are supplied to bit lines and word lines, which pass through memory cells while crossing perpendicularly. In accordance with the magnitude of a thus generated synthesized magnetic field, the magnetization direction of the free layer is controlled, thereby writing information.

Conversely, in a read mode, a voltage is applied between the two magnetic films of an MTJ element corresponding to a selected bit line, and a resistance is read from a current that flows through the MTJ element. Alternatively, a constant current is supplied to a selected MTJ element, and a voltage generated between two magnetic films is detected.

An example of an MRAM using MTJ elements is reported in, e.g., ISSCC2000 Digest of Technical Paper p. 128 "A 10 ns Read and Write Non-Volatile Memory Array using a Magnetic Tunnel Junction and FET Switch in each Cell". However, the MRAM described in this reference is designed to store 1-bit data using two MOS transistors and two MTJ elements. Hence, it is difficult to increase the capacity or the degree of integration. If the capacity or the degree of integration is increased, the access speed may decrease due to an increase in parasitic capacitance or parasitic resistance.

To increase the capacity or the degree of integration, a structure which stores 1-bit data using one selection element (MOS transistor or diode) and one MTJ element has been proposed. In addition, a structure which is called a cross-point structure has also been proposed, which requires no cell selection element for a memory cell, i.e., stores 1-bit data using one MTJ element. When the cross-point memory cell is used, the read speed may decrease, or the read margin may become small. Further improvements are demanded.

BRIEF SUMMARY OF THE INVENTION

According to an aspect of the present invention, there is provided a magnetic random access memory comprising a plurality of cell units each of which comprises cross-point memory cells that exhibit a magnetoresistive effect, word lines each of which is connected to one terminal of a corresponding one of the memory cells in each cell unit, sub bit lines each of which is commonly connected to the other terminal of each of the plurality of memory cells as a predetermined unit in each cell unit, main bit lines which are commonly connected to the plurality of sub bit lines through switch circuits, respectively, and form a hierarchical bit line structure together with the sub bit lines, a column select circuit configured to select the main bit line and connect the main bit line to a sense amplifier, and a row select circuit configured to select the word line for each cell unit by controlling the switch circuits, and in read operation, set, in a floating state, the word lines except the selected word line with a selected memory cell connected, to which unselected memory cells connected to the sub bit line to which the selected memory cell is connected are connected, and set the word lines connected to the memory cells in the cell unit which does not include the selected memory cell to the same potential as that of the main bit line.

According to another aspect of the present invention, there is provided a magnetic random access memory comprising a memory cell array of a hierarchical bit line scheme in which cross-point memory cells that exhibit a magnetoresistive effect are laid out in a matrix, and a read bit line to be used in a data read mode is constituted by a main bit line and a sub bit line, and word line potential setting means for, in read operation, setting, in a floating state, word lines to which unselected memory cells connected to the sub bit line to which the selected memory cell is connected are connected, and setting word lines except the word lines, which are connected to sub bit lines which do not include the selected memory cell to a potential substantially equal to the main bit line.

According to still another aspect of the invention, there is provided a magnetic random access memory comprising a memory cell array of hierarchical bit line scheme in which cross-point memory cells that exhibit a magnetoresistive effect are laid out in a matrix, and a read bit line to be used in a data read mode is constituted by a main bit line and a sub bit line, connection means for selectively connecting a word line connected to a cross-point memory cell to be selected to one of first and second potential supply sources which are different from each other, and control means for controlling the connection means to selectively connect the word line and to set a further word line in an electrically floating state, wherein the control means comprises first and second row decoders and word line drivers to set a potential of the word line in the read mode, and when the connection means is deactivated by the first and second row decoders and word line drivers, the further word line is set in the electrically floating state.

According to still another aspect of the invention, there is provided a magnetic random access memory comprising a memory cell array of hierarchical bit line scheme in which cross-point memory cells that exhibit a megnetoresistive effect are laid out in a matrix, and a read bit line to be used in a data read mode is constituted by a main bit line and a sub bit line, connection means for selectively connecting a word line connected to a cross-point memory cell to be selected to one of first and second potential supply sources which are different from each other, and control means for controlling the connection means to selectively connect the word line and to set a further word line in an electrically floating sate, wherein the control means comprises a row decoder and word line driver to set a potential of the word line in the read mode, and when the connection means is deactivated by the row decoder and word line driver, the further word line is set in the electrically floating sate, and the connection means comprises first and second selection circuits which connect the word line to the first and second potential supply sources on the basis of an output signal from the row decoder and word line driver, each of the first and second selection circuits being constituted by an NMOS transistor, and each NMOS transistor is controlled by the output signal from the row decoder and word line driver.

According to still another aspect of the invention there is provided a magnetic random access memory comprising a memory cell array of a hierarchical bit line scheme in which cross-point memory cells that exhibit a magnetoresistive effect are laid out in a matrix, and a read bit line to be used in a data read mode is constituted by a main bit line and a sub bit line, connection means for selectively connecting a word line connected to a cross-point memory cell to be selected to one of first and second potential supply sources which are different from each other, and control means for controlling the connection means to selectively connect the word line and to set a further word line in an electrically floating state, wherein the control means comprises a row decoder and word line driver to set a potential of the word line in the read mode, and when the connection means is deactivated by the row decoder and word line driver, the further word line is set in the electrically floating state, and the connection means comprises first and second selection circuits which connect the word line to the first and second potential supply sources on the basis of an output signal from the row decoder and word line driver, the first selection circuit being constituted by a PMOS transistor, and the second selection circuit being constituted by an NMOS transistor, and each PMOS and NMOS transistor is controlled by the output signal from the row decoder and word line driver.

According to still another aspect of the present invention, there is provided a method of reading data from a magnetic random access memory including a memory cell array of a hierarchical bit line scheme in which cross-point memory cells that exhibit a magnetoresistive effect are laid out in a matrix, and a read bit line to be used in a data read mode is constituted by a main bit line and a sub bit line, comprising setting a word line connected to a memory cell to be selected to a significant level and setting word lines in a floating state, the word lines being connected to unselected memory cells connected to the sub bit line to which the memory cell to be selected is connected, and setting word lines except the word lines, which are connected to the sub bit lines which do not include the selected memory cell, to a potential substantially equal to the main bit line.

BRIEF DESCRIPTION OF THE SEVERAL VIEWS OF THE DRAWINGS

FIG. 9 is a plan view showing an example in which an MRAM is applied to a card (MRAM card) such as a smart medium which stores media contents so as to explain Application Example 3 of the MRAMs according to the first to third embodiments of the present invention;

FIG. 10 is a plan view showing a transfer apparatus to transfer data to an MRAM card;

DETAILED DESCRIPTION OF THE INVENTION

[First Embodiment]

Figure 1:
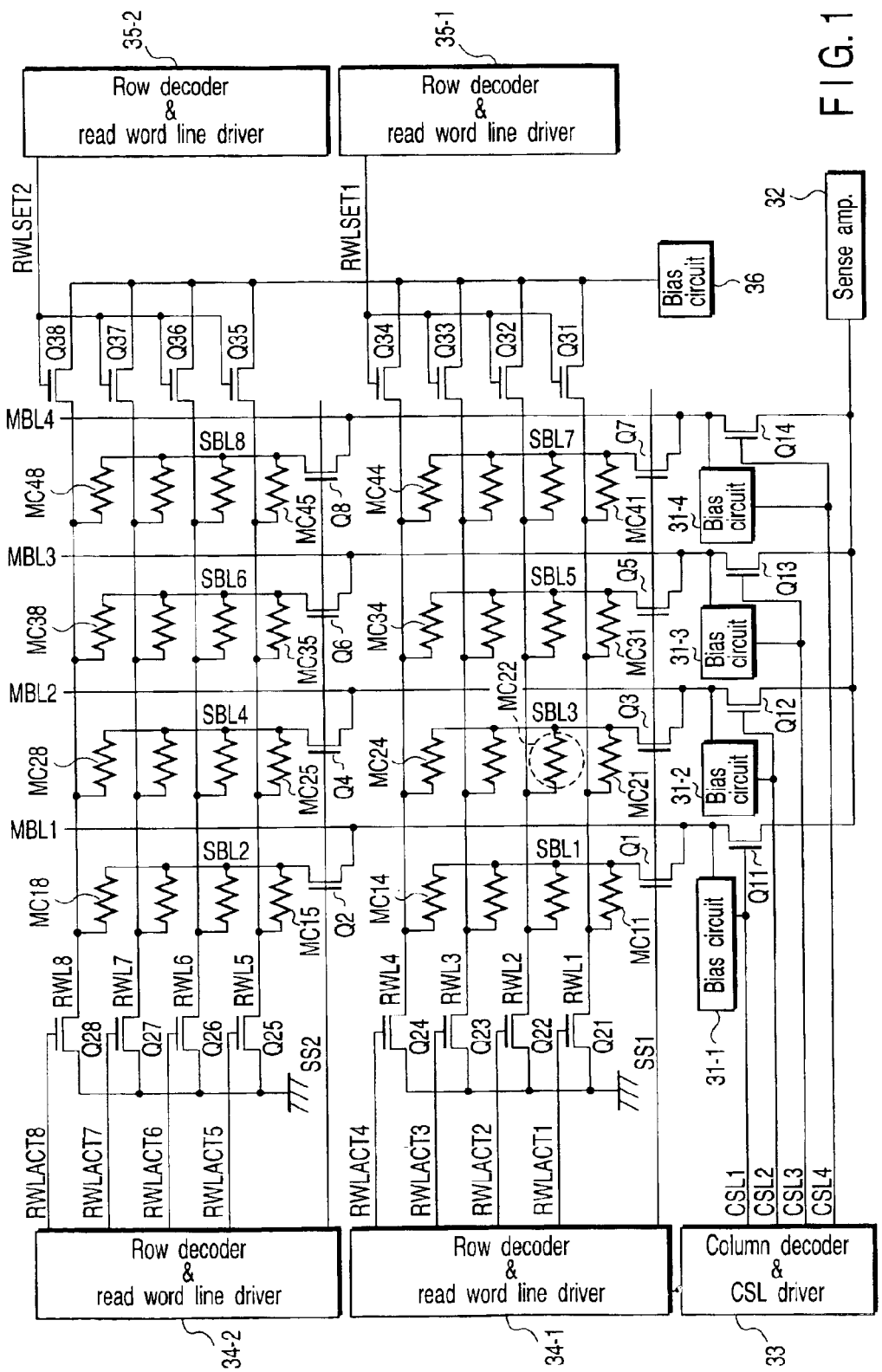
FIG. 1 is a block diagram showing the main part and, more particularly, the core portion of the read system of a magnetic random access memory (MRAM) according to the first embodiment of the present invention.

FIG. 1 is a block diagram showing the main part of a magnetic random access memory (MRAM) according to the first embodiment of the present invention. The present invention is related to a read operation. For the sake of simplicity, FIG. 1 shows the core portion of the read system and does not illustrate the core portion of the write system. Cross-point memory cells MC11 to MC48 each constructed by an MTJ element are arranged in a plurality of (two) memory cell blocks (cell units). One terminal of each to cross-point memory cells MC11 to MC14, MC21 to MC24, MC31 to MC34, and MC41 to MC44 in the first memory cell block is connected by fours to a corresponding one of sub bit lines SBL1, SBL3, SBL5, and SBL7 serving as common nodes. One terminal of each cross-point memory cells MC15 to MC18, MC25 to MC28, MC35 to MC38, and MC45 to MC48 in the second memory cell block is connected by fours to a corresponding one of sub bit lines SBL2, SBL4, SBL6, and SBL8 serving as common nodes. The sub bit lines SBL1 to SBL8 are respectively connected, for each column, to main bit lines MBL1 to MBL4 through the current paths of select MOS transistors Q1 to Q8 each functioning as a select switch (switch circuit). That is, as a cell unit selection signal, a high-level gate signal is supplied to one of the select MOS transistors Q1 to Q8 of the sub bit lines SBL1 to SBL8 including a selected cell. In other words, when a select line SS1 or SS2 is changed to a high potential, a specific one of the sub bit lines SBL1 to SBL8 can be selectively connected to a corresponding one of the main bit lines MBL1 to MBL4 for each cell unit.

A column select circuit is connected to the main bit lines MBL1 to MBL4. The column select circuit includes bias circuits 31-1 to 31-4, MOS transistors Q11 to Q14 serving as column select gates, column select lines CSL1 to CSL4, and a column decoder & column select line (CSL) driver 33.

More specifically, one end of each of the main bit lines MBL1 to MBL4 is connected to a corresponding one of the bias circuits 31-1 to 31-4. A predetermined bias voltage is applied to all the main bit lines MBL1 to MBL4. In addition, one end of each of the main bit lines MBL1 to MBL4 is selectively connected to a sense amplifier 32 through a corresponding one of the MOS transistors Q11 to Q14 such that data stored in the memory cells MC11 to MC18, MC21 to MC28, MC31 to MC38, or MC41 to MC48 are detected and amplified and read out to another circuit outside or inside the chip. The gate of each of the MOS transistors Q11 to Q14 is connected to a corresponding one of the column select lines CSL1 to CSL4. The output signals from the column decoder & column select line driver 33 are input to the column select lines CSL1 to CSL4.

On the other hand, the other terminal of each of the cross-point memory cells MC11 to MC18, MC21 to MC28, MC31 to MC38, and MC41 to MC48 is connected to an interconnection layer that changes for each row. In the read mode, the interconnection layers function as read word lines RWL (RWL1 to RWL8). Row select circuits are arranged at two ends of each of the read word lines RWL1 to RWL8. The row select circuits include MOS transistors Q31 to Q38, a bias circuit 36, first row decoders & read word line drivers 35-1 and 35-2, MOS transistors Q21 to Q28, and second row decoders & read word line drivers 34-1 and 34-2.

More specifically, one end of each of the current paths of the MOS transistors Q31 to Q38 is connected to one end of a corresponding one of the read word lines RWL1 to RWL8. The other end of each of the current paths of the MOS transistors Q31 to Q38 is connected to the output terminal of the bias circuit 36. The MOS transistors Q31 to Q38 are driven for each cell unit by word line potential setting signals RWLSET1 and RWLSET2 output from the first row decoders & read word line drivers 35-1 and 35-2. The read word lines RWL1 to RWL4 or RWL5 to RWL8 are selectively set to the bias voltage output from the bias circuit 36. The bias circuit 36 generates a bias voltage almost equal to that of the bias circuits 31-1 to 31-4 for the bit lines.

One end of each of the current paths of the MOS transistors Q21 to Q28 is connected to the other end of a corresponding one of the read word lines RWL1 to RWL8. The other end of each of the current paths of the MOS transistors Q21 to Q28 is connected to a Vss power supply (ground potential) as a reference potential. The MOS transistors Q21 to Q28 are individually driven by word line drive signals RWLACT1 to RWLACT8 output from the second row decoders & read word line drivers 34-1 and 34-2. The read word lines RWL1 to RWL8 (interconnection layers) are selectively set to a low voltage level (e.g., Vss level).

The second row decoders & read word line drivers 34-1 and 34-2 and the first row decoders & read word line drivers 35-1 and 35-2 use different word line potential control methods depending on whether the word lines RWL1 to RWL8 can be controlled individually or for each cell unit (or for each sub bit line).

For example, assume that the memory cell MC22 indicated by a broken line is selected in the data read mode. The gate input signal (select line SS1) of the select MOS transistor Q3 arranged between the sub bit line SBL3 and the main bit line MBL2, which correspond to the memory cell MC22, is changed to a high potential to turn on the select MOS transistor Q3 and connect the main bit line MBL2 to the sub bit line SBL3. In addition, only the word line drive signal RWLACT2 corresponding to the selected memory cell MC22 is changed to a high potential by the second row decoder & read word line driver 34-1. The word line potential setting signal RWLSET1 is changed to a low level by the first row decoder & read word line driver 35-1.

With this operation, a current path is formed from the main bit line MBL2 to the read word line RWL2 through the sub bit line SBL3. Subsequently, an externally input column address signal is decoded by a column decoder in the column decoder & CSL driver 33. The column select signal CSL2 is changed to a high potential by the CSL driver to turn on the MOS transistor Q12 and connect the main bit line MBL2 to the sense amplifier 32. At this time, the bias circuit (bit line bias circuit) 31-2 connected to the main bit line MBL2 is set in an inactive state by the column select signal CSL2.

An equipotential (a potential almost equal) to the bit line bias circuit 31-2 is applied from the sense amplifier 32 to the selected main bit line MBL2. A current that flows to the selected cell MC22 is detected and amplified to read out the stored information.

At this time, the word lines RWL1, RWL3, and RWL4 connected to the unselected cells (MC21, MC23, and MC24) connected to the sub bit line SBL3 including the selected cell MC22 are controlled to a floating state by the row decoders & read word line drivers 35-1 and 34-1. On the other hand, the word lines RWL5 to RWL8 connected to the unselected cells MC15 to MC18, MC25 to MC28, MC35 to MC38, and MC45 to MC48 connected to the sub bit lines SBL2, SBL4, SBL6, and SBL8, which do not include the selected cell MC22, are set to the bias voltage output from the bias circuit 36, i.e., a bias voltage almost equal to the main bit lines MBL1 to MBL4 because the MOS transistors Q35 to Q38 are set in an ON state and the MOS transistors Q25 to Q28 are set in an OFF state by the row decoders & read word line drivers 35-2 and 34-2.

In the circuit shown in FIG. 1, the memory cells MC11 to MC18, MC21 to MC28, MC31 to MC38, and MC41 to MC48 corresponding to 32 bits are exemplified. In an actual MRAM, the memory cells are two-dimensionally appropriately integrated and laid out. In this example, 4-bit memory cells are connected to each of the sub bit lines SBL1 to SBL4. This structure can also be appropriately changed.

Figure 2:
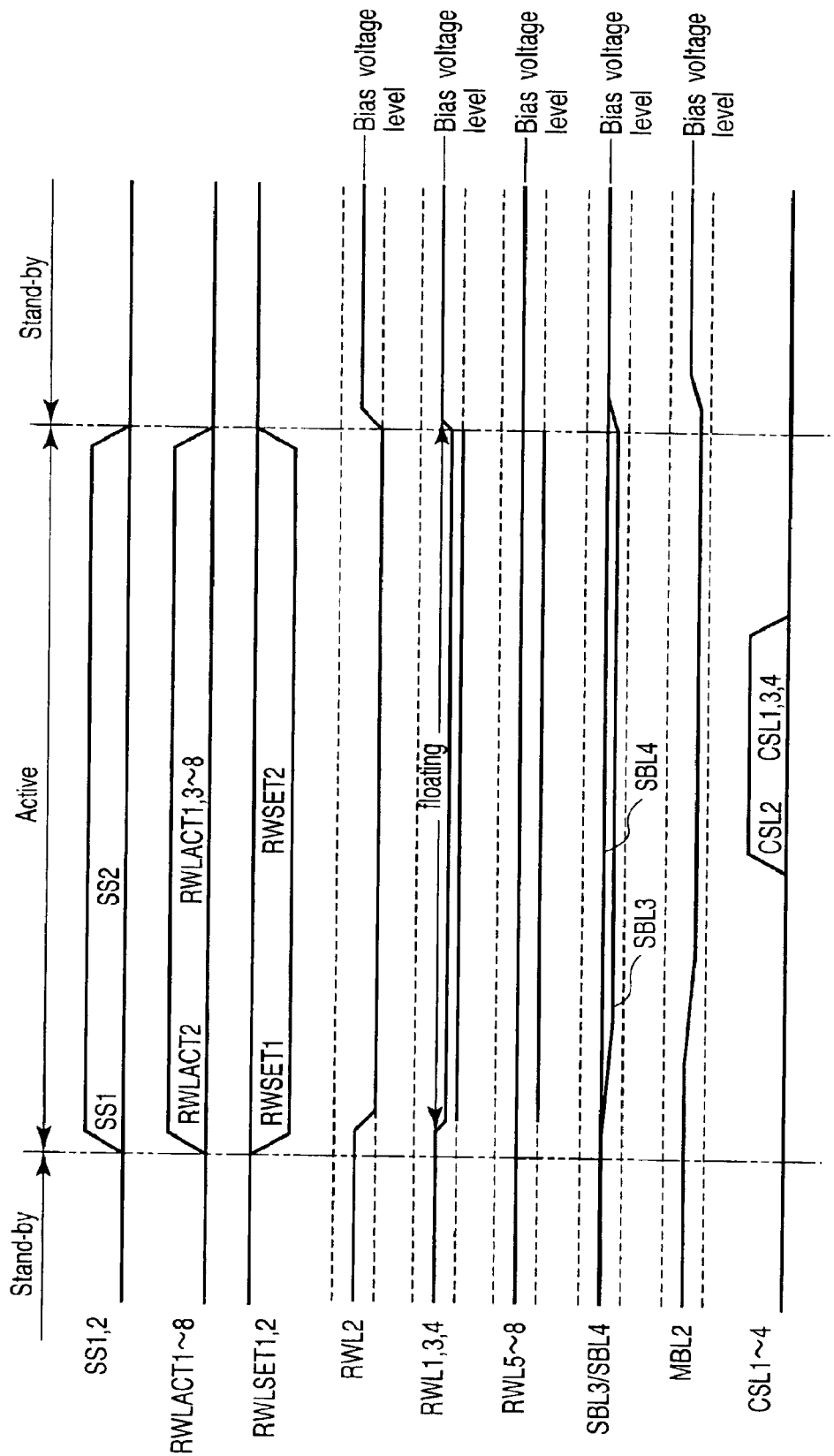
FIG. 2 is a timing chart of the read operation of the MRAM shown in FIG. 1.

FIG. 2 is a timing chart of the read operation when the memory cell MC22 is selected. In the stand-by state, all the MOS transistors Q1 to Q8 serving as select switches between the sub bit lines SBL1 to SBL8 and the main bit lines MBL1 to MBL4 are set in the OFF state. Hence, the select lines SS1 and SS2 are in a low potential state. On the other hand, all the main bit lines MBL1 to MBL4 are set to a predetermined bias voltage by the bit line bias circuits 31-1 to 31-4. When the column select signals CSL1 to CSL 4 as the output signals from the column decoder & CSL driver 33 are set to a low potential, the sense amplifier 32 is disconnected from all the bit lines (main bit lines MBL1 to MBL4 and sub bit lines SBL1 to SBL8). All the word lines RWL1 to RWL8 are connected to the bias circuit (word line bias circuit) 36 by setting the output signals RWLACT1 to RWLACT8 for the second row decoders & read word line drivers 34-1 and 34-2 to a low potential and the output signals RWLSET1 and RWLSET2 from the first row decoders & read word line drivers 35-1 and 35-2 to a high potential.

The word line bias circuit 36 and bit line bias circuits 31-1 to 31-4 generate almost the same bias voltage. In the stand-by state, all the main bit lines MBL1 to MBL4 and read word lines RWL1 to RWL8 are precharged to the same potential. In addition, since the MTJ elements MC11 to MC48 are mere resistive elements, all the sub bit lines SBL1 to SBL8 are set to the same potential as that of the word lines and bit lines through the read word lines RWL1 to RWL8.

Conversely, in the active state, since it is assumed that the memory cell MC22 is selected, the select line SS1 as the gate input signal and the word line drive signal RWLACT2 change to a high potential, and the word line potential setting signal RWLSET1 changes to a low potential. Accordingly, a current path is formed through MBL2→SBL3→RWL2. In addition, the column select signal CSL2 changes to the high potential upon inputting the column address signal corresponding to the selected cell MC22, so the selected main bit line MBL2 and sense amplifier 32 are electrically connected. As a result, only data of the selected cell MC22 is transferred to the sense amplifier 32, detected and amplified, and then read out from the memory through a read system circuit group (not shown). At this time, the bias circuit 31-2 of the selected main bit line MBL2 is set in the inactive state by the column select signal CSL2.

The word lines RWL1, RWL3, and RWL4 for the remaining unselected cells connected to the sub bit line SBL3 including the selected cell MC22 are controlled to the electrically floating state because the word line potential setting signal RWLSET1 changes to the low potential. At this time, the word line potential setting signal RWLSET2 still holds the high potential state. Hence, the word lines RWL5 to RWL8 of the memory cells MC15 to MC18, MC25 to MC28, MC35 to MC38, and MC45 to MC48 connected to the sub bit lines SBL2, SBL4, SBL6, and SBL8, which do not include the selected cell MC22, are kept connected to the word line bias circuit 36. As a result, the word lines RWL5 to RWL8 hold to be equipotential to the main bit lines MBL1 to MBL4. For this reason, the potentials of the sub bit lines SBL2, SBL4, SBL6, and SBL8 which are disconnected from the main bit lines MBL1 to MBL4 are also set in a low impedance state. Hence, the sub bit lines SBL2, SBL4, SBL6, and SBL8 can hold to be equipotential to the main bit lines MBL1 to MBL4. Accordingly, when an arbitrary memory cell connected to the sub bit lines SBL2, SBL4, SBL6, and SBL8 is accessed in the next cycle, any variation or decrease in speed can be avoided.

[Second Embodiment]

Figure 3:
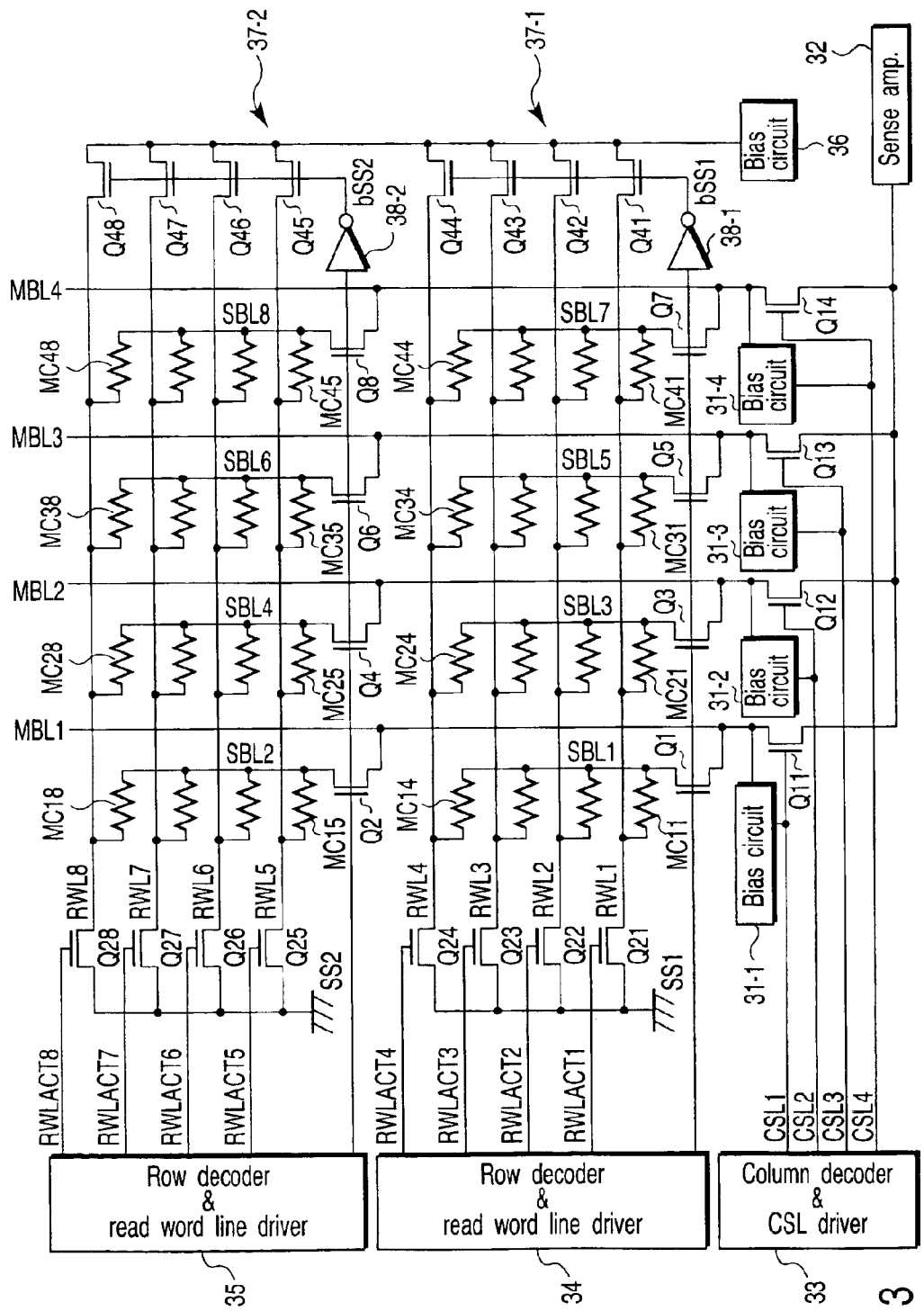
FIG. 3 is a block diagram showing the main part and, more particularly, the core portion of the read system of a magnetic random access memory (MRAM) according to the second embodiment of the present invention.

FIG. 3 is a block diagram showing the schematic structure of an MRAM according to the second embodiment of the present invention. The same reference numerals as in FIG. 1 denote the same parts in FIG. 3, and a detailed description thereof will be omitted. The second embodiment is different from the first embodiment in that a row decoder & read word line driver is arranged only at one end of each of read word lines RWL1 to RWL8, though the row decoders & read word line drivers are arranged at two ends in FIG. 1.

To implement this circuit scheme, selection circuits 37-1 and 37-2 which selectively select the read word lines RWL1 to RWL4 and RWL5 to RWL8 to a bias circuit 36 for each cell unit are arranged. The selection circuit 37-1 is constituted by NMOS transistors Q41 to Q44 each of which has a current path having one end connected to a corresponding one of the read word lines RWL1 to RWL4 and the other end commonly connected to the output terminal of the bias circuit 36, and an inverter 38-1 which logically inverts a gate signal (a signal that is transferred through a select line SS1 to selectively connect sub bit lines SBL1, SBL3, SBL5, and SBL7 to main bit lines MBL1 to MBL4) output from a row decoder & read word line driver 34. A signal bSS1 output from the inverter 38-1 is supplied to the gates of the MOS transistors Q41 to Q44. The selection circuit 37-2 is constituted by NMOS transistors Q45 to Q48 each of which has a current path having one end connected to a corresponding one of the read word lines RWL5 to RWL8 and the other end commonly connected to the output terminal of the bias circuit 36, and an inverter 38-2 which logically inverts a gate signal (a signal that is transferred through a select line SS2 to selectively connect sub bit lines SBL2, SBL4, SBL6, and SBL8 to the main bit lines MBL1 to MBL4) output from a row decoder & read word line driver 35. A signal bSS2 output from the inverter 38-2 is supplied to the gates of the MOS transistors Q45 to Q48.

Figure 4:
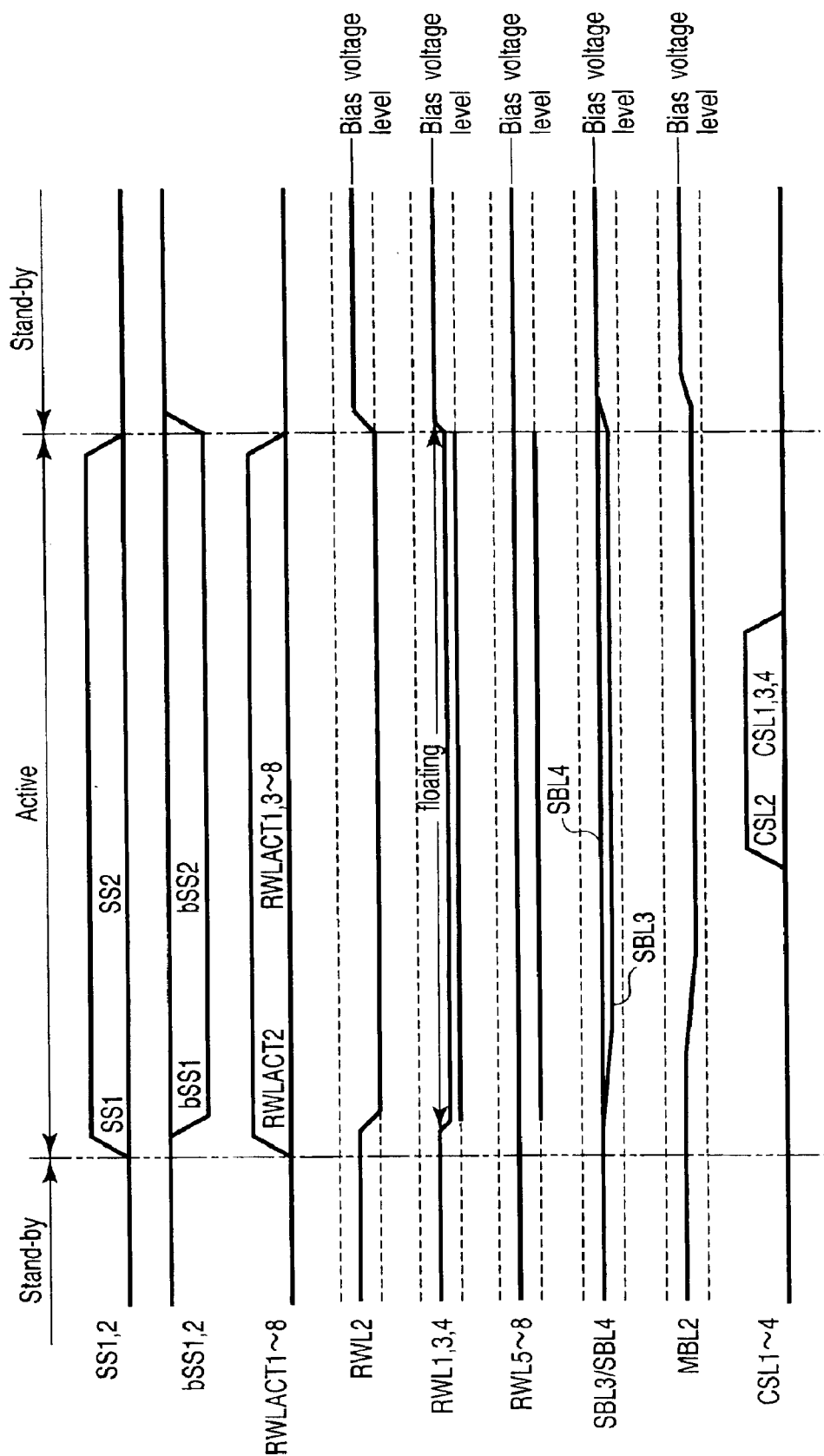
FIG. 4 is a timing chart of the read operation of the MRAM shown in FIG. 3.

FIG. 4 is an operation timing chart of the MRAM according to the second embodiment. As is apparent from the comparison between the timing chart shown in FIG. 4 and that shown in FIG. 2, the basic operation is the same as in the first embodiment except that the inverted signals bSS1 and bSS2 of the gate signals (select lines SS1 and SS2) are used for the operation of selectively connecting the read word lines RWL1 to RWL4 and RWL5 to RWL8 to the bias circuit 36 for each cell unit.

Hence, in the second embodiment as well, the same functions and effects as in the above-described first embodiment can be obtained.

[Third Embodiment]

Figure 5:
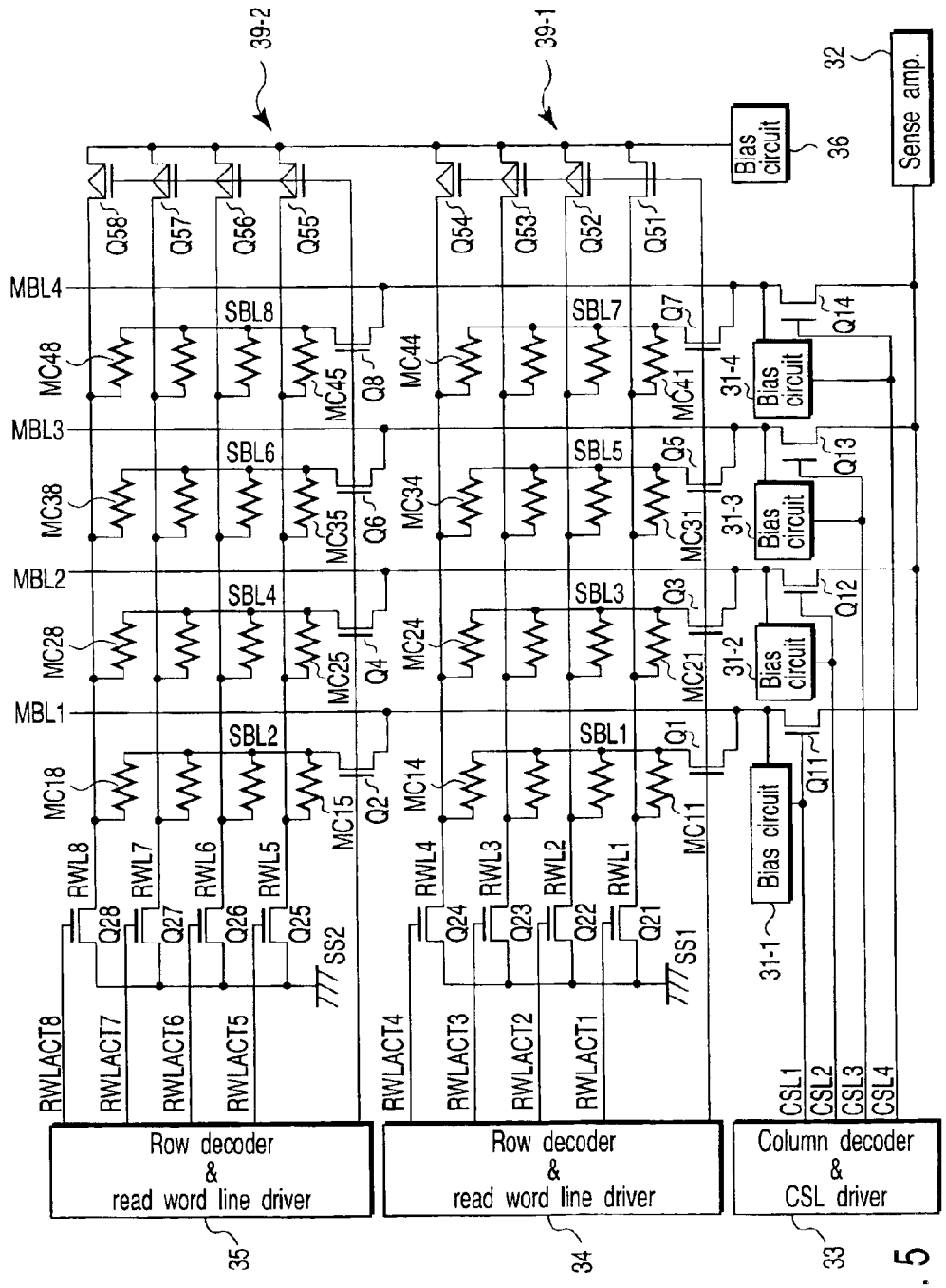
FIG. 5 is a block diagram showing the main part and, more particularly, the core portion of the read system of a magnetic random access memory (MRAM) according to the third embodiment of the present invention.

FIG. 5 is a block diagram showing the schematic structure of an MRAM according to the third embodiment of the present invention. In the third embodiment, a row decoder & read word line driver is arranged only at one end of each of read word lines RWL1 to RWL8, as in FIG. 3, though the row decoders & read word line drivers are arranged at two ends in FIG. 1. Selection circuits 39-1 and 39-2 are formed from PMOS transistors Q51 to Q54 and Q55 to Q58 to directly supply gate signals (signals that are transferred through select lines SS1 and SS2 to selectively connect sub bit lines to main bit lines) to the MOS transistors Q51 to Q54 and Q55 to Q58.

Figure 6:
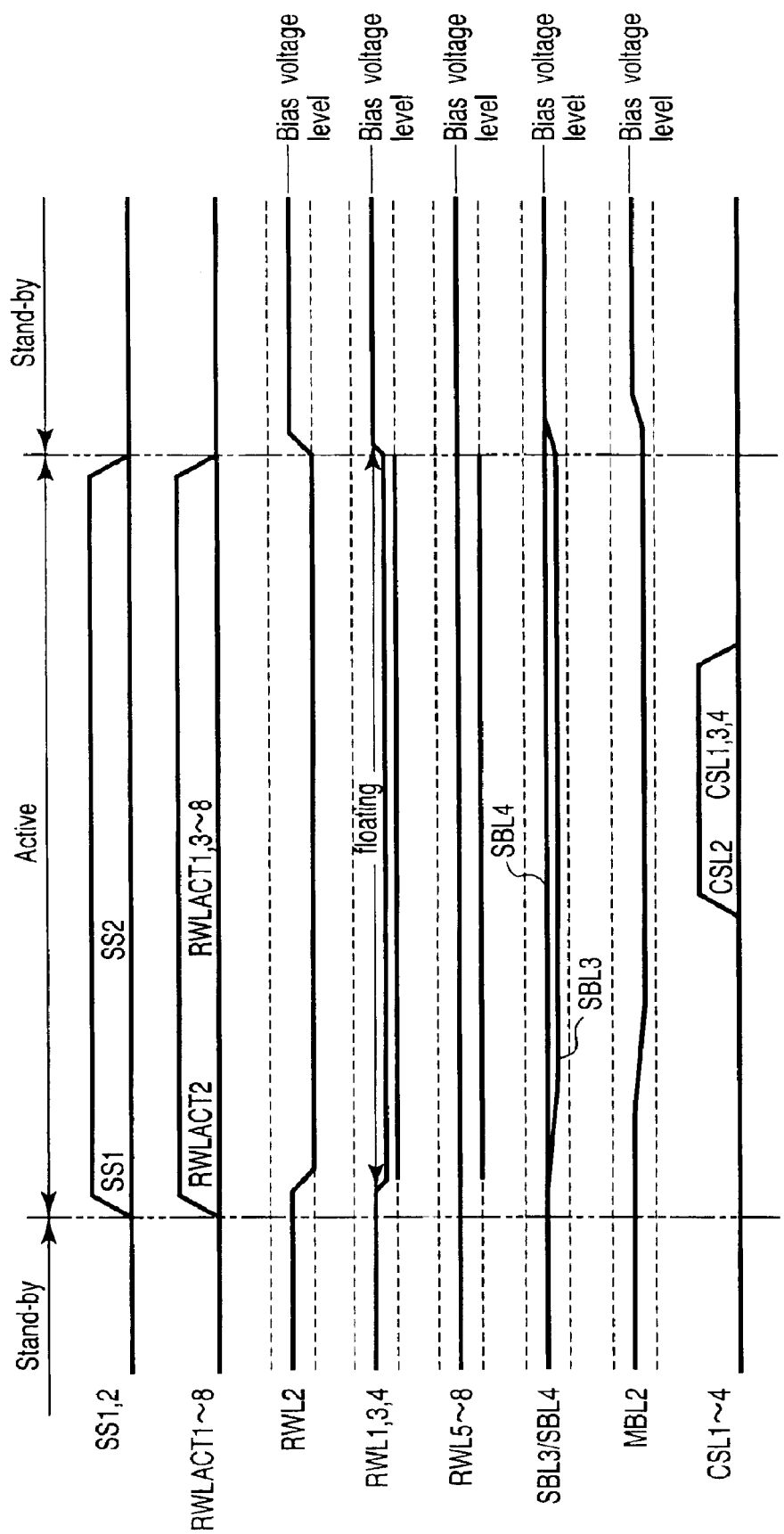
FIG. 6 is a timing chart of the read operation of the MRAM shown in FIG. 5.

FIG. 6 is an operation timing chart in the third embodiment. The basic operation is the same as in the first and second embodiments except that the gate signals (the potentials of the select lines SS1 and SS2) are used for the operation of selectively connecting the read word lines RWL1 to RWL4 and RWL5 to RWL8 to the bias circuit 36 for each cell unit.

Hence, in the third embodiment as well, the same functions and effects as in the above-described first and second embodiments can be obtained.

As described above, according to the embodiments of the present invention, since cross-point memory cells which require no cell selection elements are used, the capacity or the degree of integration can easily be increased. In addition, the divided bit line structure (hierarchical bit line scheme) is employed. In the read operation, the word lines of all memory cells connected to the same sub bit line (divided bit line) as that of the selected memory cell are held in the electrically floating state. In addition, the same potential as that of all the main bit lines is supplied to the word lines of all memory cells connected to sub bit lines (divided bit lines) different from the selected cell. Accordingly, the error current component in the read mode, which is unique to the cross-point memory cells, can be suppressed. Furthermore, when the potential of all the sub bit lines (divided bit lines) in the unselected state is set to the same potential as that of the main bit lines, the speed of read operation can be increased. Hence, an MRAM which can easily increase the capacity, has a large read operation margin, and is capable of high-speed read access can be implemented.

The magnetic random access memories (semiconductor memory devices) according to the first to third embodiments of the present invention can be applied to various apparatuses. FIGS. 7 to 13 shows application examples.

APPLICATION EXAMPLE 1

Figure 7:
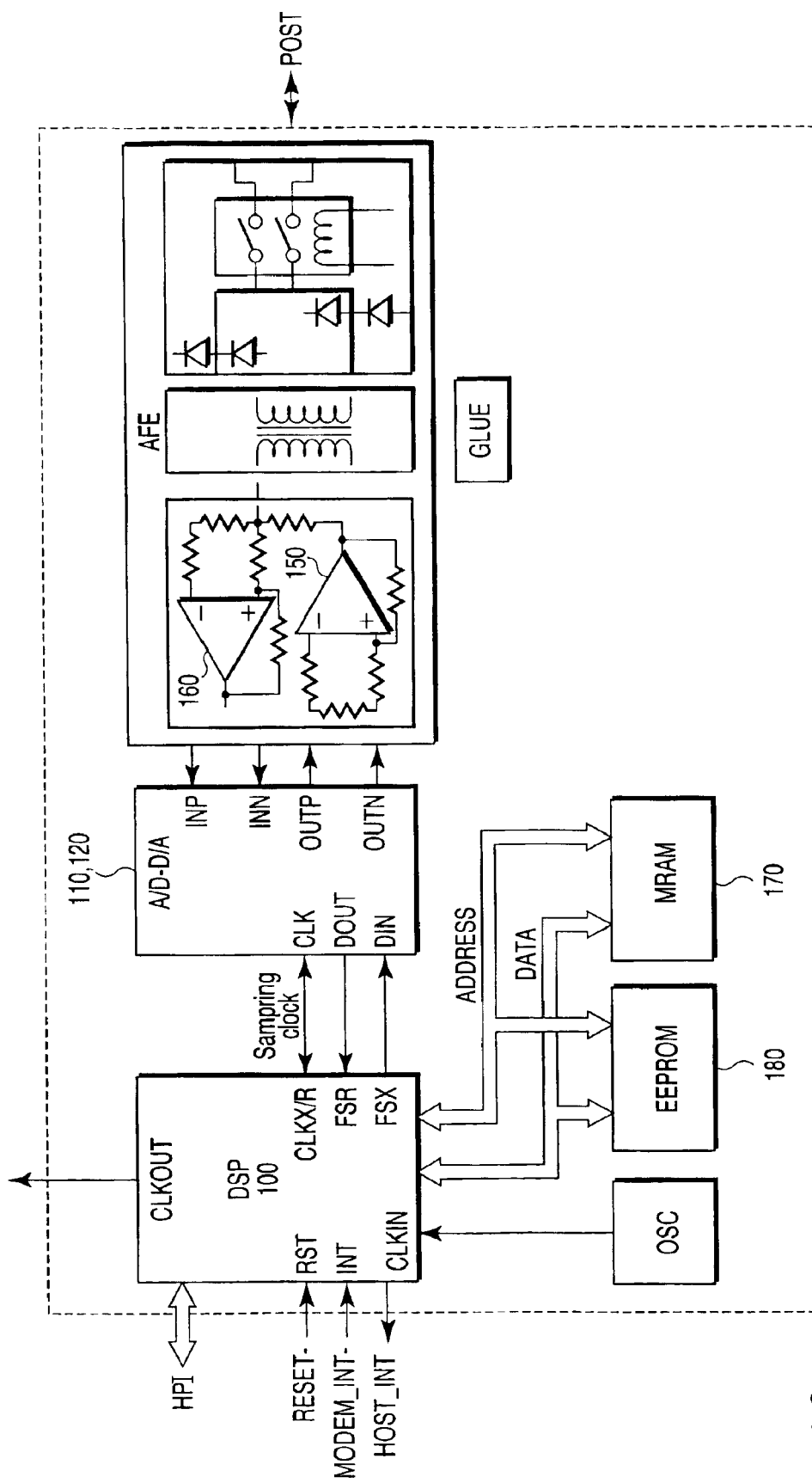
FIG. 7 is a block diagram showing the DSL (Digital Subscriber Line) data path portion of a DSL modem so as to explain Application Example 1 of the MRAMs according to the first to third embodiments of the present invention.

FIG. 7 shows the DSL (Digital Subscriber Line) data path portion of a DSL modem. This modem includes a programmable digital signal processor (DSP) 100, analog/digital (A/D) converter 110, digital/analog (D/A) converter 120, a transmission driver 150, and receiver amplifier 160. FIG. 7 does not illustrate a bandpass filter. Instead, a magnetic random access memory 170 according to one of the embodiments and an EEPROM 180 are illustrated as optional memories of various types to hold a line code program (a program which is executed by the DSP to select and operate a modem in accordance with encoded subscriber line information and transmission conditions [line code; QAM, CAP, RSK, FM, AM, PAM, DWMT, and the like]).

In Application Example 1, two kinds of memories, i.e., the magnetic random access memory 170 and EEPROM 180 are used as memories to hold the line code program. The EEPROM 180 may be replaced with a magnetic random access memory. That is, instead of using two types of memories, only magnetic random access memories may be used.

APPLICATION EXAMPLE 2

Figure 8:
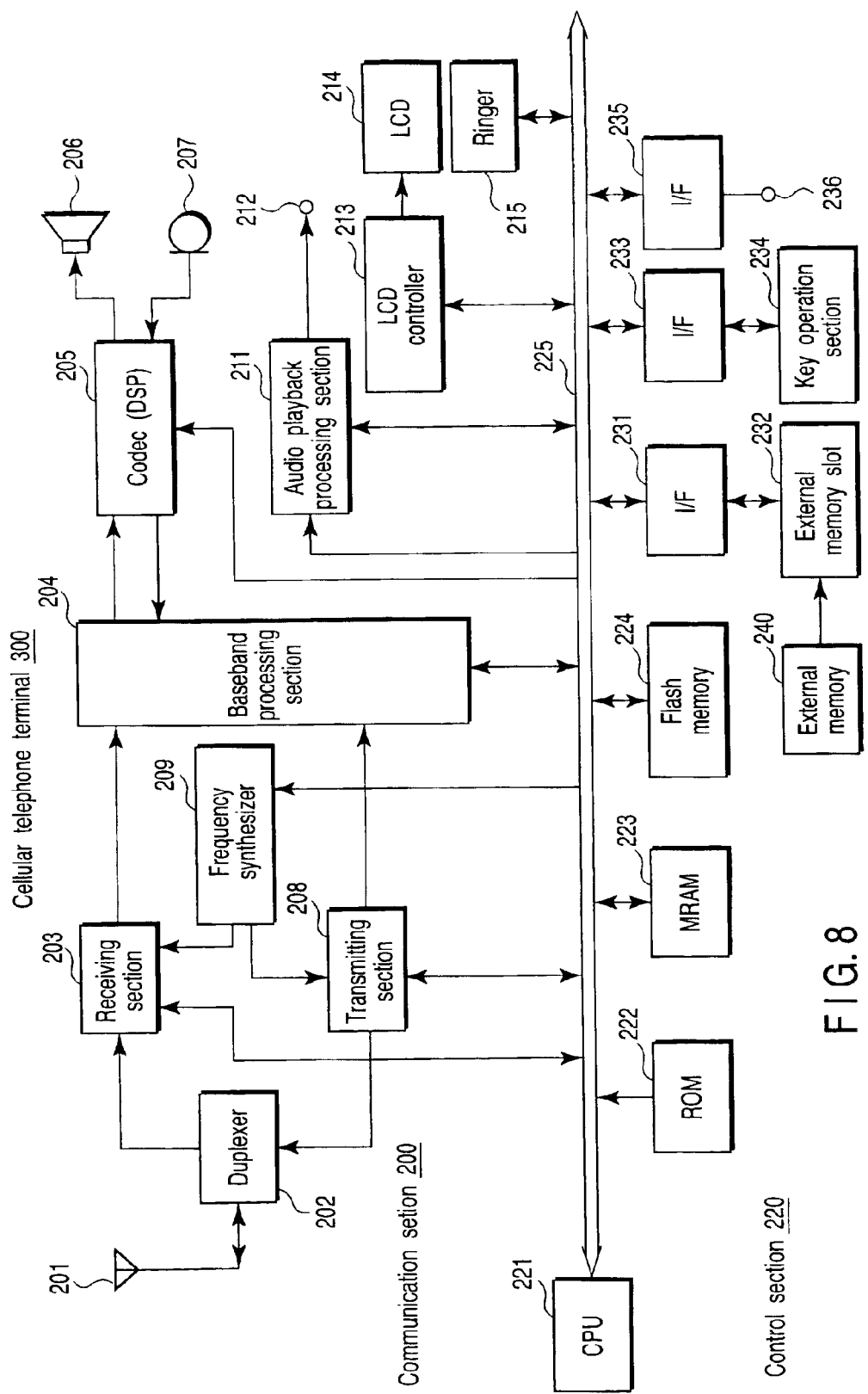
FIG. 8 is a block diagram showing a cellular telephone terminal so as to explain Application Example 2 of the MRAMs according to the first to third embodiments of the present invention.

FIG. 8 shows a cellular telephone terminal 300 as another application example. A communication section 200 which implements a communication function comprises a transmitting/receiving antenna 201, an antenna duplexer 202, a receiving section 203, a baseband processing section 204, a DSP 205 used as a voice codec, a loudspeaker (receiver) 206, a microphone (transmitter) 207, a transmitting section 208, and a frequency synthesizer 209.

The cellular telephone terminal 300 has a control section 220 which controls the sections of the cellular telephone terminal. The control section 220 is a microcomputer which is formed by connecting a CPU 221, a ROM 222, a magnetic random access memory (MRAM) 223 according to one of the embodiments, and a flash memory 224 through a CPU bus 225. The ROM 222 stores, in advance, a program to be executed by the CPU 221 and data necessary for display fonts and the like. The MRAM 223 is mainly used as a word area where the CPU 221 stores data midway through calculation during executing the program as needed, or data exchanged between the control section 220 and the respective sections are temporarily stored. Even when the cellular telephone terminal 300 is powered off, the flash memory 224 stores, e.g., the immediately preceding set conditions, so the same set conditions can be used when the cellular telephone terminal 300 is powered on again. Accordingly, even when the cellular telephone terminal is powered off, the stored setting parameters are not erased.

The cellular telephone terminal 300 also has an audio playback processing section 211, an external output terminal 212, an LCD controller 213, a LCD (liquid crystal display) 214 for display, and a ringer 215 which generates a ringing signal. The audio playback processing section 211 plays back audio information input to the cellular telephone terminal 300 (or audio information stored in an external memory 240 (to be described later)). The audio information that is played back can be transmitted to an earphone or a portable loudspeaker through the external output terminal 212 and extracted to the outside. When the audio playback processing section 211 is arranged, audio information can be reproduced in this way. The LCD controller 213 receives display information from, e.g., the CPU 221 through the CPU bus 225, converts the display information into LCD control information to control the LCD 214, and drives the LCD 214 to cause it to perform display.

The cellular telephone terminal 300 also has interface circuits (I/Fs) 231, 233, and 235, the external memory 240, an external memory slot 232, a key operation section 234, and an external input/output terminal 236. The external memory slot 232 receives the external memory 240 such as a memory card. The external memory slot 232 is connected to the CPU bus 225 through the interface circuit (I/F) 231. As described above, when the slot 232 is prepared in the cellular telephone terminal 300, information in the cellular telephone terminal 300 can be written in the external memory 240. Alternatively, information (e.g., audio information) stored in the external memory 240 can be input to the cellular telephone terminal 300. The key operation section 234 is connected to the CPU bus 225 through the interface circuit (I/F) 233. Key input information input from the key operation section 234 is transmitted to, e.g., the CPU 221. The external input/output terminal 236 is connected to the CPU bus 225 through the interface circuit (I/F) 233 and functions as a terminal in inputting various kinds of external information to the cellular telephone terminal 300 or outputting information externally from the cellular telephone terminal 300.

In Application Example 2, the ROM 222, MRAM 223, and flash memory 224 are used. The flash memory 224 may be replaced with a magnetic random access memory. The ROM 222 may also be replaced with a magnetic random access memory.

APPLICATION EXAMPLE 3

FIGS. 9 to 13 show an example in which a magnetic random access memory is applied to a card (MRAM card) such as a smart medium which stores media contents.

An MRAM card main body 400 incorporates an MRAM chip 401. An opening portion 402 is formed in the card main body 400 at a position corresponding to the MRAM chip 401 so the MRAM chip 401 is exposed. The opening portion 402 has a shutter 403. When the MRAM card is carried, the MRAM chip 401 is protected by the shutter 403. The shutter 403 is made of a material such as a ceramic capable of shielding an externally magnetic field. When data is to be transferred, the shutter 403 is opened to expose the MRAM chip 401. An external terminal 404 is used to extract content data stored in the MRAM card.

Figure 11:
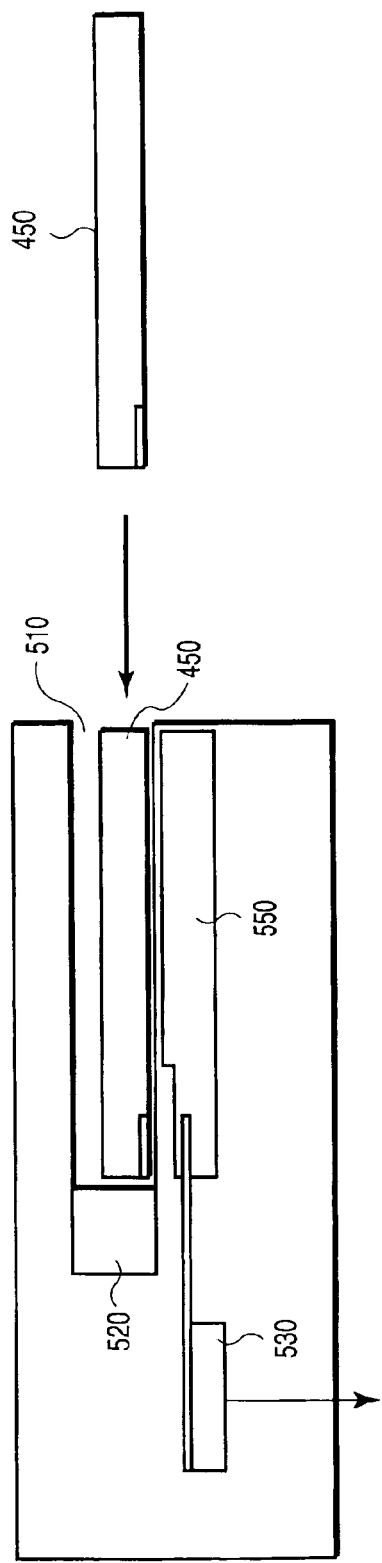
FIG. 11 is a sectional view showing the transfer apparatus to transfer data to an MRAM card.

FIGS. 10 and 11 show a transfer apparatus which transfers data to the MRAM card. FIG. 10 is a plan view of a card insertion type transfer apparatus. FIG. 11 is a sectional view of the transfer apparatus. A second MRAM card 450 used by an end user is inserted from an insertion portion 510 of a transfer apparatus 500, as indicated by the arrow, and pushed into until the card abuts against a stopper 520. The stopper 520 also functions as a member to position a first MRAM 550 and the second MRAM card 450. When the second MRAM card 450 is located at a predetermined position, a control signal is supplied from a first MRAM rewrite control section to an external terminal 530 to transfer data stored in the first MRAM 550 to the second MRAM card 450.

Figure 12:
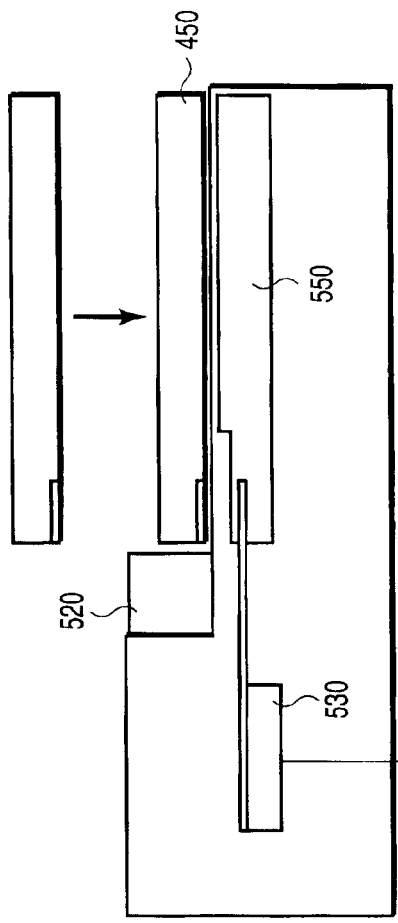
FIG. 12 is a sectional view showing a fitting type transfer apparatus to transfer data to an MRAM card.

FIG. 12 shows a fitting type transfer apparatus. In this transfer apparatus, the second MRAM card 450 is fitted on the first MRAM 550 with reference to the stopper 520, as indicated by the arrow. The transfer method is the same as in the card insertion type, and a description thereof will be omitted.

Figure 13:
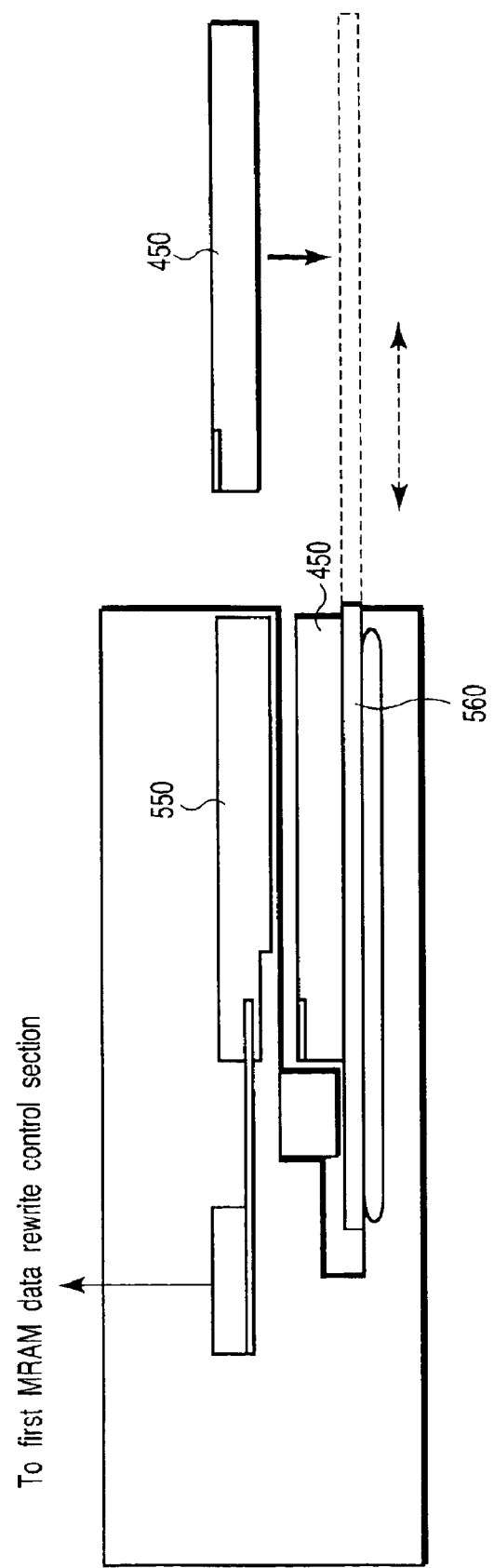
FIG. 13 is a sectional view showing a slide type transfer apparatus to transfer data to an MRAM card.

FIG. 13 shows a slide type transfer apparatus. The transfer apparatus 500 has a sliding tray 560, like a CD-ROM drive or DVD drive. The sliding tray 560 moves, as indicated by the arrow. When the sliding tray 560 moves to the position indicated by the broken line, the second MRAM card 450 is mounted on the sliding tray 560 and conveyed into the transfer apparatus 500. The structure that conveys the second MRAM card 450 until it abuts against the stopper 520 and the transfer method are the same as in the card insertion type, and a description thereof will be omitted.

As described above, according to one aspect of this invention, a magnetic random access memory which can increase the capacity or the degree of integration and also realize a high access speed, and a data read method thereof can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   a plurality of cell units, each cell unit including a plurality of cross-point memory cells having first and second terminals and configured to exhibit a magnetoresistive effect;
   a plurality of word lines, each word line being connected to the first terminals of a corresponding first pluralilty of the cross-point memory cells in each cell unit;
   a plurality of sub bit lines, each sub bit line being connected to the second terminals of a second corresponding plurality of the cross-point memory cells so as to form sub bit line interconnected units in each cell unit;
   a plurality of main bit lines, each main bit line being connected to at least one sub bit line interconnected unit in each cell unit by corresponding sub bit lines through first switch circuits and forming a hierarchical bit line structure together with the sub bit lines in each cell unit;
   a column select circuit configured to select one main bit line and to connect the selected one main bit line to a sense amplifier; and
   a row select circuit configured to select one word line at a time from a corresponding cell unit connected to a selected cross-point memory cell by controlling selecting circuits during a read operation to set all other word lines in the cell unit having the selected word line to a floating state while maintaining a different state for the one selected word line and to set the word lines in the cell units not having the one selected word line to a same potential as that normally applied to all the main bit lines.

2. The memory according to claim 1, wherein the plurality of cross-point memory cells in each cell unit are laid out in a matrix with the plurality of word lines in each cell unit forming each matrix row, and each main bit line and connected sub bit line interconnected unit in each cell unit forming each matrix column.

3. The memory according to claim 1, wherein each first switch circuit includes a first MOS transistor having a current path with one end connected to the sub bit line of a corresponding sub bit line interconnected unit and with an opposite end connected to a corresponding main bit line, wherein each first MOS transistor is ON/OFF-controlled by a cell unit select signal output from the row select circuit.

4. The memory according to claim 1, wherein the column select circuit comprises:
   a plurality of second MOS transistors, each second MOS transistor having a current path with one end connected to a corresponding main bit line and with an opposite end connected to the sense amplifier,
   a plurality of column select lines with each column select line connected to each gate of each second MOS transistor,
   a CSL driver configured to output a column address select signal to a selected column select line to selectively drive the selected column select line,
   a column decoder configured to decode a column address signal and to supply the column address signal to the CSL driver, and
   a first bias circuit configured to selectively apply a bias voltage to each main bit line on the basis of the column address select signal output from the CSL driver.

5. The memory according to claim 1, wherein the row select circuit includes:
   a read word line driver configured to selectively control the states of the word lines in each cell unit and to control the first switch circuit connected between each sub bit line interconnected unit and each main bit line in each cell unit to connect the sub bit line interconnected unit in the cell unit which includes the selected cross-point memory cell to the main bit line being selected, and a row decoder configured to decode a row address signal and to supply the row address signal to the read word line driver.

6. The memory according to claim 1, wherein the selecting circuits include a plurality of third MOS transistors, each third MOS transistor having a current path with one end connected to one end of each word line and with an opposite end commonly connected to a second bias circuit configured to apply a bias voltage to said opposite end of each third MOS transistor, a first read word line driver configured to selectively drive each third MOS transistor for each cell unit, a first row decoder configured to decode a row address signal and supplies the row address signal to the first read word line driver, a plurality of fourth MOS transistors, each fourth MOS transistor having a current path with one end connected to a second end of each word line and with an opposite end commonly connected, a second read word line driver configured to selectively drive a fourth MOS transistor and to control the first switch circuits for each cell unit to connect a sub bit line interconnected unit in the cell unit which includes the selected cross-point memory cell to the corresponding main bit line, and a second row decoder which decodes the row address signal and supplies the row address signal to the second read word line driver.

7. The memory according to claim 1, wherein the selecting circuits include a plurality of third MOS transistors, each third MOS transistor having a current path with one end connected to one end of each word line and with an opposite end commonly connected to a second bias circuit configured to apply a bias voltage to the opposite end of each third MOS transistor, a fourth MOS transistor having a current path with one end connected to a second end of each word line and with an opposite end commonly connected, a read word line driver configured to selectively drive a fourth MOS transistor and to control the first switch circuits and the third MOS transistors for each cell unit to connect a sub bit line interconnected unit in the cell unit which includes the selected cross-point memory cell to the corresponding main bit line, and a row decoder which decodes a row address signal and supplies the row address signal to the read word line driver.

8. The memory according to claim 7, wherein the third MOS transistor comprises an NMOS transistor, and an inverted signal of the signal supplied to the first switch circuits is supplied to a gate of each third MOS transistor for each cell unit.

9. The memory according to claim 7, wherein the third MOS transistor comprises a PMOS transistor, and the signal supplied to the first switch circuits is supplied to a gate of each third MOS transistor for each cell unit.

10. The memory according to claim 4, wherein the first bias circuit is configured to stop applying the bias voltage to the selected one main bit line on the basis of a column address select signal output from the CSL driver.

11. The memory according to claim 10, wherein the selected one main bit line is connected to the sense amplifier in response to the column address select signal, and a voltage substantially equal to the bias voltage output from the first bias circuit is applied from the sense amplifier to the selected one main bit line.

12. The memory according to claim 6, wherein the bias voltage output from the second bias circuit is substantially equal to the bias voltage output from the first bias circuit.

13. The memory according to claim 7, wherein the bias voltage output from the second bias circuit is substantially equal to the bias voltage output from the first bias circuit.

14. A magnetic random access memory comprising:

a memory cell array of a hierarchical bit line scheme in which cross-point memory cells that exhibit a magnetoresistive effect are laid out in a matrix, and a read bit line to be used in a data read mode is constituted by a main bit line and a sub bit line; and word line potential setting means for, in read operation, setting, in a floating state, first word lines to which unselected cross-point memory cells connected to the sub bit line to which the selected cross-point memory cell is connected are connected, and setting word lines except the first word lines, which are connected to sub bit lines which do not include the selected cross-point memory cell to a potential substantially equal to a potential applied the main bit line.

15. The memory according to claim 14, wherein a potential of the word line connected to the selected cross-point memory cell is different from those of the word lines connected to unselected cross-point memory cells connected to the sub bit lines which do not include the selected cross-point memory cell.

16. The memory according to claim 14, further comprising bias means for holding the potential of the main bit line at a predetermined bias voltage.

17. The memory according to claim 16, wherein the bias means stops applying the bias voltage to the selected main bit line in response to a column address select signal which selects a column address of the memory cell array.

18. The memory according to claim 17, wherein the selected main bit line is connected to a sense amplifier in response to the column address select signal, and a voltage substantially equal to the bias voltage output from the bias means is applied from the sense amplifier to the selected main bit line.

19. A magnetic random access memory comprising:

a memory cell array of a hierarchical bit line scheme in which cross-point memory cells that exhibit a magnetoresistive effect are laid out in a matrix, and a read bit line to be used in a data read mode is constituted by a main bit line and a sub bit line;

connection means for selectively connecting a word line connected to a cross-point memory cell to be selected to one of first and second potential supply sources which are different from each other; and control means for controlling the connection means to selectively connect the word line and to set a further word line in an electrically floating state, wherein the control means comprises first and second row decoders and word line drivers to set a potential of the word line in the read mode, and when the connection means is deactivated by the first and second row decoders and word line drivers, the further word line is set in the electrically floating state.

20. The memory according to claim 19, wherein the connection means comprises first and second selection circuits which connect the word line to the first and second potential supply sources on the basis of output signals from the first and second row decoders and word line drivers, each of the first and second selection circuits being constituted by an NMOS transistor, and each NMOS transistor is controlled by the output signals from the first and second row decoders and word line drivers.

21. The memory according to claim 20, wherein the signal supplied from the first row decoder and word line driver to the first selection circuit is independent for each sub bit line, and the signal supplied from the second row decoder and word line driver to the second selection circuit is independent for each word line.

22. A magnetic random access memory comprising:

a memory cell array of hierarchical bit line scheme in which cross-point memory cells that exhibit a magnetoresistive effect are laid out in a matrix, and a read bit line to be used in a data read mode is constituted by a main bit line and a sub bit line;

connection means for selectively connecting a word line connected to a cross-point memory cell to be selected to one of the first and second potential supply sources which are different from each other; and control means for controlling the connection means to selectively connect the word line and to set a further word line in an electrically floating state, wherein the control means comprises a row decoder and word line driver to set a potential of the word line in the read mode, and when the connection means is deactivated by the row decoder and word line driver, the further word line is set in the electrically floating state, and the connection means comprises first and second selection circuits which connect the word line to the first and second potential supply sources on the basis of an outout signal from the row decoder and word line driver, each of the first and second selection circuits being constituted by an NMOS transistor, and each NMOS transistor is controlled by the output signal from the row decoder and word line driver.

23. The memory according to claim 22, wherein the signal supplied from the row decoder and word line driver to the first selection circuit is a signal obtained by logically inverting a select signal between the main bit line and the sub bit line, and the signal supplied from the row decoder and word line driver to the second selection circuit is independent for each word line.

24. A magnetic random access memory comprising:

a memory cell array of hierarchical bit line scheme in which cross-point memory cells that exhibit a magnetoresistive effect are laid out in a matrix, and a read bit line to be used in a data read mode is constituted by a main bit line and a sub bit line;

connection means for selectively connecting a word line connected to a cross-point memory cell to be selected to one of first and second potential supply sources which are different from each other; and control means for controlling the connection means to selectively connect the word line and to set a further word line in an electrically floating state, wherein the control means comprises a row decoder and word line driver to set a potential of the word line in the read mode, and when the connection means is deactivated by the row decoder and word line driver, the further word line is set in the electrically floating state, and the connection means comprises first and second selection circuits which connect the word line to the first and second potential supply sources on the basis of an output signal from the row decoder and word line driver, the first selection circuit being constituted by a PMOS transistor, and the second selection circuit being constituted by an NMOS transistor, and each PMOS and NMOS transistor is controlled by the output signal from the row decoder and word line driver.

25. The memory according to claim 24, wherein the output signal supplied from the row decoder and word line driver to the first selection circuit is a select signal between the main bit line and the sub bit line, and the output signal supplied from the row decoder and word line driver to the second selection circuit is independent for each word line.

26. A method of reading data from a magnetic random access memory including a memory cell array of a hierarchical bit line scheme in which cross-point memory cells that exhibit a magnetoresistive effect are laid out in a matrix, and a read bit line to be used in a data read mode is constituted by a main bit line and a sub bit line, comprising:

asserting a word line connected to a cross-point memory cell to be selected and setting first word lines connected to unselected cross-point memory cells connected to the sub bit line to which the cross-point memory cell to be selected is connected in a floating state; and setting second word lines connected to sub bit lines which are not connected to the selected cross-point memory cell, to a potential substantially equal to the main bit line.

27. The method according to claim 26, further comprising after setting the second word lines to the potential substantially equal to the main bit line, connecting the sub bit line to which the selected cross-point memory cell is connected to the main bit line and selecting the main bit line and connecting the main bit line to a sense amplifier, and causing the sense amplifier to detect and amplify stored data in the cross-point selected memory cell and read out the data.

* * * * *